United States Patent
Lee et al.

(10) Patent No.: US 10,373,660 B1
(45) Date of Patent: Aug. 6, 2019

(54) APPARATUSES AND METHODS FOR DUTY CYCLE DISTORTION CORRECTION OF CLOCKS

(71) Applicant: MICRON TECHNOLOGY, INC., Boise, ID (US)

(72) Inventors: Hyun Yoo Lee, Boise, ID (US); Kang-Yong Kim, Boise, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/274,992

(22) Filed: Feb. 13, 2019

Related U.S. Application Data

(63) Continuation of application No. 15/903,934, filed on Feb. 23, 2018, now Pat. No. 10,249,354.

(51) Int. Cl.
| | |
|---|---|
| *G11C 8/16* | (2006.01) |
| *G11C 7/22* | (2006.01) |
| *G11C 8/18* | (2006.01) |
| *G11C 11/4076* | (2006.01) |
| *H03K 5/156* | (2006.01) |

(52) U.S. Cl.
CPC ............ *G11C 7/22* (2013.01); *G11C 8/18* (2013.01); *G11C 11/4076* (2013.01); *H03K 5/1565* (2013.01)

(58) Field of Classification Search
CPC ...... G11C 7/1051; G11C 7/1084; G11C 7/222
See application file for complete search history.

(56) References Cited

U.S. PATENT DOCUMENTS

| | | | | |
|---|---|---|---|---|
| 5,689,460 | A  * | 11/1997 | Ooishi ................ | G11C 5/143 327/530 |
| 6,396,329 | B1 | 5/2002 | Zerbe | |
| 6,700,814 | B1 * | 3/2004 | Nahas .................. | G11C 7/06 365/158 |
| 6,870,419 | B1 * | 3/2005 | Garrett, Jr. .......... | G06F 13/4077 327/535 |
| 8,189,403 | B2 * | 5/2012 | Sohn .................... | H03F 1/3211 331/175 |
| 9,202,561 | B1 * | 12/2015 | Park ..................... | G11C 13/0038 |

(Continued)

FOREIGN PATENT DOCUMENTS

| | | |
|---|---|---|
| KR | 20030045771 A | 6/2003 |
| KR | 20110003189 A | 1/2011 |
| KR | 20110097838 A | 8/2011 |

OTHER PUBLICATIONS

PCT Application No. PCT/US2018/065738 titled "Apparatuses and Methods for Duty Cycle Error Correction of Clock Signals" filed Dec. 14, 2018.

(Continued)

*Primary Examiner* — Tuan T Nguyen
(74) *Attorney, Agent, or Firm* — Dorsey & Whitney LLP

(57) ABSTRACT

Apparatuses and methods for duty cycle distortion correction of clocks are disclosed. An example apparatus includes a clock circuit configured to receive complementary input clocks and a control signal and to provide multiphase clocks responsive to complementary input clocks. The clock circuit is further configured to be in a first mode or second mode controlled by the control signal and configured to provide the multiphase clocks having greater duty cycle distortion in a first mode than in a second mode.

20 Claims, 6 Drawing Sheets

(56) References Cited

U.S. PATENT DOCUMENTS

| | | |
|---|---|---|
| 9,449,687 B1* | 9/2016 | Piccardi ............... G11C 13/004 |
| 2003/0221044 A1 | 11/2003 | Nishio et al. |
| 2006/0170453 A1 | 8/2006 | Zerbe et al. |
| 2008/0036509 A1 | 2/2008 | Jang |
| 2008/0159017 A1* | 7/2008 | Kim ...................... G11C 5/147 |
| | | 365/189.09 |
| 2010/0134153 A1 | 6/2010 | Zerbe et al. |
| 2012/0086489 A1 | 4/2012 | Cherkassky et al. |
| 2013/0051114 A1* | 2/2013 | Kim ................... G11C 11/1673 |
| | | 365/145 |
| 2015/0222254 A1 | 8/2015 | Walker |
| 2015/0364176 A1 | 12/2015 | Lee |
| 2017/0140726 A1 | 5/2017 | Zhu et al. |

OTHER PUBLICATIONS

PCT Application No. PCT/US2019/016528, titled "Apparatuses and Methods for Duty Cycle Distortion Correction of Clocks", filed Feb. 4, 2019.
U.S. Appl. No. 15/903,9324 entitled 'Apparatuses and Methods for Duty Cycle Distortion Correction of Clocks' filed Feb. 23, 2018.
U.S. Appl. No. 15/853,514, entitled 'Apparatuses and Methods for Duty Cycle Error Correction of Clock Signals', filed Dec. 22, 2017.
International Search Report and Written Opinion for PCT Patent Application No. PCT/US2019/016528 dated May 17, 2019, pp. all.
Raja, Immanuel et al., "A 0.1-2-GHz Quadrature Correction Loop for Digital Multiphase Clock Generation Circuits in 130-nm CMOS", IEEE Transactions on Very Large Scale Integration (VLSI) Systems, vol. 25, Issue 3, Mar. 31, 2017., pp. 1-10.

* cited by examiner

US 10,373,660 B1

APPARATUSES AND METHODS FOR DUTY CYCLE DISTORTION CORRECTION OF CLOCKS

CROSS-REFERENCE TO RELATED APPLICATION

This application is a continuation of U.S. patent application Ser. No. 15/903,934, filed Feb. 23, 2018. This application is incorporated by reference herein in its entirety and for all purposes.

BACKGROUND

Semiconductor memories are used in many electronic systems to store data that may be retrieved at a later time. As the demand has increased for electronic systems to be faster, have greater data capacity, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clocks. The various signals may be provided by a memory controller, for example. The command signals may control the semiconductor memories to perform various memory operations, for example, a read operation to retrieve data from a memory, and a write operation to store data to the memory. The data may be provided between the controller and memories with known timing relative to receipt by the memory of an associated command. The known timing is typically defined by latency information. The latency information may be defined by numbers of clock cycles of system clocks CK and CKF.

With newly developed memories, the memories may be provided with system clocks that are used for timing the command signals and address signals, for example, and further provided with data clocks that are used for timing the read data provided by the memory and for timing the write data provided to the memory. The memories may also provide clocks to the controller for timing the provision of data provided to the controller.

The clocks provided to the memories are used to provide internal clocks that control the timing of various circuits during operation. The timing of the circuits during operation may be critical, and deviations in the timing of the clocks may cause erroneous operation. An example deviation in the timing of the clocks may be duty cycle distortion, that is, deviation from a 50% duty cycle.

Duty cycle distortion in clocks may be corrected using duty cycle correction circuits. However, conventional duty cycle correction circuits may be relatively large and require considerable area on a semiconductor die, and additionally, conventional duty cycle correction circuits consume more power than desirable. As a result, alternative circuits for reducing duty cycle distortion may be desirable.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the disclosure described herein should not be construed to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
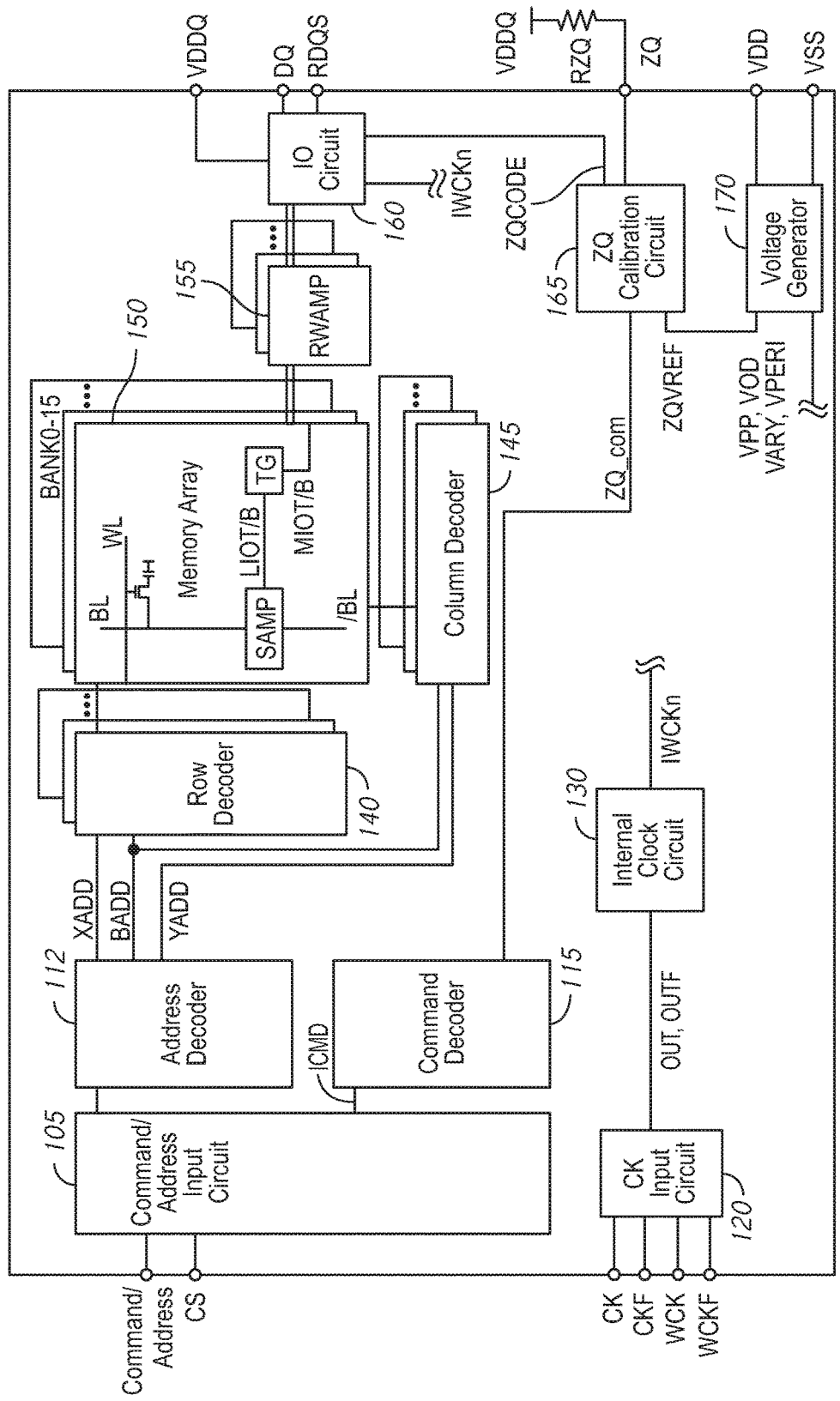
FIG. 1 is a block diagram of an apparatus according to an embodiment of the disclosure.

FIG. 1 is a block diagram of an apparatus according to an embodiment of the disclosure. The apparatus may be a semiconductor device 100, and will be referred as such. In some embodiments, the semiconductor device 100 may include, without limitation, a DRAM device, such as low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 100 may employ a plurality of external terminals that include command and address terminals coupled to a command and address bus to receive command and address, a chip select terminal CS, clock terminals to receive clocks CK and CKF, data clock terminals to receive data clocks WCK and WCKF, data terminals DQ and RDQS, power supply terminals VDD, VSS, and VDDQ, and the ZQ calibration terminal (ZQ).

The command and address terminals may be supplied with an address and a bank address, for example, from a memory controller. The address and the bank address supplied to the command and address terminals are transferred, via a command/address input circuit 105, to an address decoder 112. The address decoder 112 receives the address and supplies a decoded row address XADD to the row decoder 140, and a decoded column address YADD to the column decoder 145. The address decoder 112 also receives the bank address and supplies a decoded bank address BADD to the row decoder 140, the column decoder 145.

The command and address terminals may further be supplied with command from, for example, a memory controller. The command may be provided as internal command signals ICMD to a command decoder 115 via the command/address input circuit 105. The command decoder 115 includes circuits to decode the internal command signals ICMD to generate various internal signals and commands for performing operations. For example, the command decoder 115 may provide a row command signal to select a word line and a column command signal to select a bit line. Another example may be providing internal signals to enable circuits for performing operations, such as control signals to enable signal input buffers that receive clocks.

When a read command is received and a row address and a column address are timely supplied with the read command, read data is read from a memory cell in the memory array 150 designated by the row address and column address. The read command is received by the command decoder 115, which provides internal commands to input/output circuit 160 so that read data is output to outside from the data terminals DQ via read/write amplifiers 155 and strobe clock is provided to outside from the terminals RDQS. The read data is provided at a time following receipt of the read command as defined by read latency information RL that may be programmed in the semiconductor device 100, for example, in a mode register (not shown in FIG. 1). The read latency information RL may be defined in terms of clock cycles of the CK clock. For example, the read latency information RL may be a number of clock cycles of the CK clock after the read command is received by the semiconductor device 100 when the associated read data is provided.

When the write command is received and a row address and a column address are timely supplied with this command, then write data is supplied to the data terminals DQ according to the WCK and WCKF clocks. The write command is received by the command decoder 115, which provides internal commands to the input/output circuit 160 so that the write data is received by data receivers in the input/output circuit 160, and supplied via the input/output circuit 160 and the read/write amplifiers 155 to the memory array 150. The write data is written in the memory cell designated by the row address and the column address. The write data is provided to the data terminals DQ at a time that is defined by write latency WL information. The write latency WL information may be programmed in the semiconductor device 100, for example, in the mode register (not shown in FIG. 1). The write latency WL information may be defined in terms of clock cycles of the CK clock. For example, the write latency information WL may be a number of clock cycles of the CK clock after the write command is received by the semiconductor device 100 when the associated write data is provided.

Turning to an explanation of the external terminals included in the semiconductor device 100, the clock terminals and data clock terminals are supplied with external clocks. The external clocks CK, CKF, WCK, WCKF may be supplied to a clock input circuit 120 from a memory controller. The CK and CKF clocks are complementary and the WCK and WCKF clocks are complementary. For example, rising edges of the CK clock occur at the same time as falling edges of the CKF clock and falling edges of the CK clock occur at the same time as rising edges of the CKF clock. When enabled, input buffers included in the clock input circuit 120 receive the external clocks. For example, the clock input circuit 120 may receive the external clocks to generate internal clocks, including OUT and OUTF clocks. The internal clocks OUT and OUTF are supplied to internal clock circuit 130.

The internal clock circuit 130 includes circuits that provide various phase and frequency controlled internal clocks based on the received internal clocks. For example, the internal clock circuit 130 may include a data clock path that receives the OUT and OUTF clocks and provides multiphase clocks IWCKn based on the internal clocks OUT and OUTF. As will be described in more detail below, the multiphase clocks IWCKn have relative phases with each other and have a phase relationship with the WCK and WCKF clocks. The multiphase clocks IWCKn may also be provided to the input/output circuit 160 for controlling an output timing of read data and the input timing of write data. The input/output circuit 160 may include driver circuits for generating and providing the strobe clock from the RDQS terminal to outside such as a memory controller and an application processor.

The power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI, and the like and a reference potential ZQVREF based on the power supply potentials VDD and VSS. The internal potential VPP is mainly used in the row decoder 140, the internal potentials VOD and VARY are mainly used in the sense amplifiers SAMP included in the memory array 150, and the internal potential VPERI is used in many other circuit blocks. The reference potential ZQVREF is used in a ZQ calibration circuit 165.

The power supply terminal is also supplied with power supply potential VDDQ. The power supply potential VDDQ is supplied to the input/output circuit 160 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 160 so that power supply noise generated by the input/output circuit 160 does not propagate to the other circuit blocks.

A calibration terminal ZQ is connected to the ZQ calibration circuit 165. The ZQ calibration circuit 165 performs a calibration operation with reference to an impedance of a ZQ calibration resistor RZQ, and the reference potential ZQVREF, when activated by the ZQ calibration command ZQ_com. An impedance code ZQCODE obtained by the calibration operation is supplied to the input/output circuit 160 to set an impedance of an output buffer (not shown) included in the input/output circuit 160.

Figure 2:
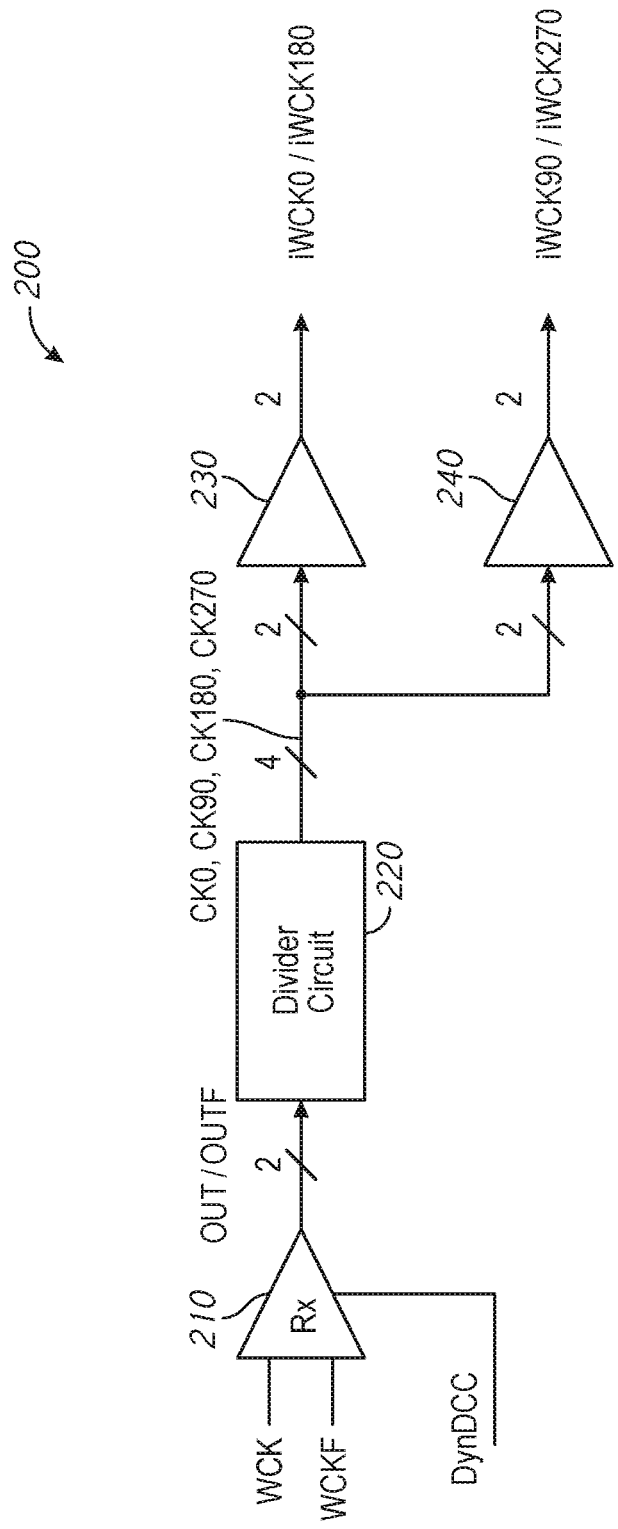
FIG. 2 is a block diagram of a clock circuit according to an embodiment of the disclosure.

FIG. 2 of is a block diagram of a clock circuit 200 according to an embodiment of the disclosure. Portions of the clock circuit 200 may be included in the clock input circuit 120 and/or internal clock circuit 130 of FIG. 1 in some embodiments of the disclosure.

The clock circuit 200 includes receiver circuit 210 and a clock divider circuit 220. The receiver circuit 210 receives data clocks WCK and WCKF and provides complementary output clocks OUT and OUTF. The receiver circuit 210 may be included in the clock input circuit 120 of the semiconductor device 100 in some embodiments of the disclosure.

The receiver circuit 210 provides OUT and OUTF clocks based on and that have the same clock frequency as the WCK and WCKF clocks. The receiver circuit 210 also receives a control signal DynDCC. The DynDCC signal maybe provided by a command decoder (e.g., command decoder 115 of FIG. 1). The DynDCC signal may have a value corresponding to a value programmed in a mode register. For example, the value of the DynDCC signal may be set by programming a value (e.g., "0" or "1") for a corresponding bit in the mode register. The command decoder may provide the DynDCC signal having the programmed value.

As will be described, characteristics of the OUT and OUTF clocks may be changed based on the DynDCC signal. For example, the OUT and OUTF clocks may have a first voltage swing when the DynDCC signal has a first logic level (e.g., first mode), and have a second voltage swing when the DynDCC signal has a second logic level (second mode). Other characteristics may be changed as well or alternatively. The characteristics of the OUT and OUTF clock may be changed, for example, based on a command and operation. For example, the first voltage swing may be used with write commands and the second voltage swing may be used with read commands.

The OUT and OUTF clocks are provided to the divider circuit 220. The divider circuit 220 provides multiphase clocks CK0, CK90, CK180, and CK270 that have a lower clock frequency than the OUT and OUTF (and WCK and WCKF) clocks. The CK0, CK90, CK180, and CK270 may have a phase relationships relative to one another. For example, the CK90 clock may be 90 degrees out of phase relative to the CK0 clock; and the CK180 clock may be 90 degrees out of phase relative to the CK90 clock; and the CK270 clock may be 90 degrees out of phase relative to the CK180 clock. In some embodiments of the disclosure, the CK0, CK90, CK180, and CK270 clocks have one-half the clock frequency of the OUT and OUTF clocks (and also one-half the clock frequency of the WCK and WCKF clocks).

The CK0 and CK180 clocks are provided to a buffer circuit 230, which provides buffered clocks iWCK0 and iWCK180, and the CK90 and CK270 clocks are provided to a buffer circuit 240, which provides buffered clocks iWCK90 and iWCK270. The divider circuit 220 may be included in the internal clock circuit 130 in some embodiments of the disclosure. The iWCK0 and iWCK180, and iWCK90 and iWCK270 clocks may be provided to other circuits that operate according to the clocks. For example, the iWCK0, iWCK90, iWCK180, iWCK270 clocks may be provided to an input/output circuit to time the provision and/or receipt of data (e.g., input/output circuit 160 of FIG. 1).

The WCK and WCKF clocks provided to the receiver circuit 210 may have a duty cycle distortion. Typically, a clock having duty cycle distortion deviates from an ideal clock having a high clock level for half of the clock period and having a low clock level for the other half of the clock period. The duty cycle for an ideal clock is 50%. Duty cycle distortion may cause a clock to have a duty cycle that is greater or less than 50%. Duty cycle distortion may be caused by changing system conditions, such as power supply voltage fluctuation, temperature changes, etc. Conventional duty cycle correction circuits (DCC) may have challenges in correcting the dynamic duty cycle distortion due to the changing system conditions that cause the distortion.

The iWCK0, iWCK90, iWCK180, and iWCK270 clocks have reduced duty cycle distortion relative to the WCK and WCKF clocks. As will be described, the receiver circuit 210 provides the OUT and OUTF clocks to the divider circuit 220 with characteristics that may cause the divider circuit 220 to provide the CK0, CK90, CK180, and CK270 clocks having reduced duty cycle distortion relative to the WCK and WCKF clocks. The resulting iWCK0 and iWCK180, and iWCK90 and iWCK270 clocks provided by the buffer circuits 230 and 240 may also have reduced duty cycle distortion relative to the WCK and WCKF clocks.

Figure 3:
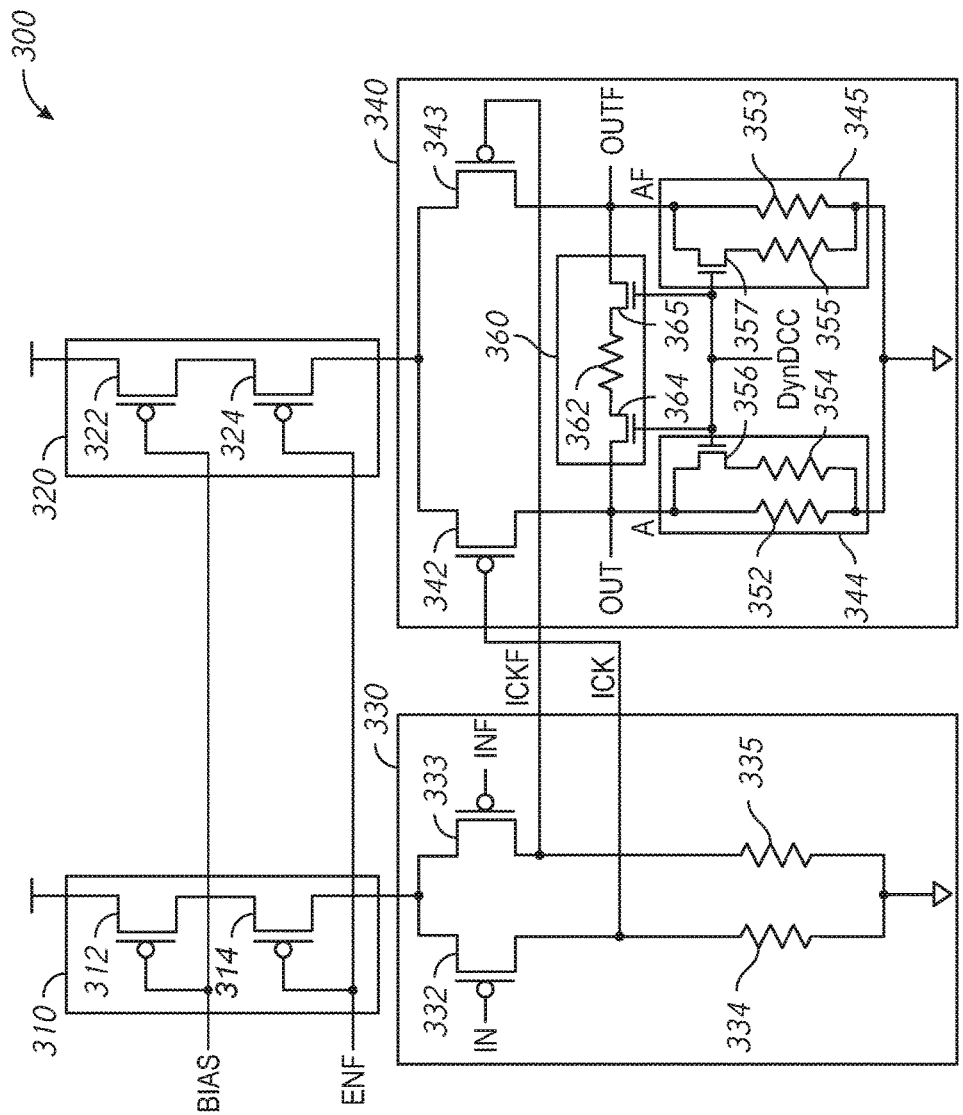
FIG. 3 is a schematic diagram of a receiver circuit according to an embodiment of the disclosure.

FIG. 3 is a schematic diagram of a receiver circuit 300 according to an embodiment of the disclosure. The receiver circuit 300 may be included in the clock input circuit 120 of the semiconductor device 100 in some embodiments of the disclosure. The receiver circuit 300 may be included in the receiver circuit 210 of FIG. 2 in some embodiments of the disclosure. In such embodiments, the IN and INF clocks of FIG. 3 may be provided by the WCK and WCKF clocks of FIG. 2.

The receiver circuit 300 receives complementary clocks IN and INF, and when activated, provides complementary clocks OUT and OUTF. The OUT and OUTF clocks may have different characteristics as controlled by a control signal DynDCC. The receiver circuit 300 includes current sources 310 and 320 configured to be coupled to a high supply node configured to be coupled to a power supply. When enabled by an active enable signal ENF (e.g., active low logic level), the current sources 310 and 320 provide respective currents based on the bias signal BIAS. The ENF and BIAS signals may be provided by a command decoders, for example, the command decoder 115 in some embodiments of the disclosure. The current source 310 includes transistors 312 and 314 coupled in series and the current source 320 includes transistors 322 and 324 coupled in series. The BIAS signal is provided to the transistors 312 and 322. The magnitude of the BIAS signal controls the magnitude of current provided by the current sources 310 and 320 by setting conductivity of the transistors 312 and 322. The ENF signal is provided to the transistors 314 and 324. An active ENF signal activates the transistors 314 and 324 to allow current from the transistors 312 and 322 to be provided.

The receiver circuit 300 further includes an input circuit 330 and gain circuit 340. The input circuit 330 is provided current from the current source 310 and the gain circuit 340 is provided current from the current source 320. The input circuit 330 includes an input transistor 332 and a resistance 334 coupled in series from the current source 310 to a low supply node configured to be provided a reference voltage (e.g., ground). The input circuit 330 further includes an input transistor 333 and a resistance 335 coupled in series from the current source 310 to the low supply node. The IN and INF clocks are provided to the input to the input transistors 332 and 333, respectively, and the input circuit provides complementary output clocks ICK and ICKF to the gain circuit 340.

The gain circuit 340 includes an input transistor 342 and a variable resistance 344 coupled in series from the current source 320 to the low supply node. The gain circuit 340 further includes an input transistor 343 and variable resistance 345 coupled in series from the current source 320 to the low supply node. In some embodiments of the disclosure, for example, in the embodiment shown in FIG. 3, the variable resistance 344 includes a resistance 352 coupled from a node A to the low supply node and further includes transistor 356 coupled in series with resistance 354 from node A to the low supply node, and the variable resistance 345 includes a resistance 353 coupled from node AF to the low supply node and further includes transistor 357 coupled in series with resistance 355 from node AF to the low supply node. A resistance circuit 360 may be coupled to node A and node AF. The resistance circuit 360 includes transistors 364 and 365, and a resistance 362. A control signal DynDCC is provided to the variable resistances 344 and 345, and the resistance circuit 360. The resistance circuit 360 may be omitted in some embodiments of the disclosure. The input transistor 342 is provided the ICK clock and the input transistor 343 is provided the ICKF clock from the input circuit 330. Output clock OUT is provided at node A and output clock OUTF is provided at node AF.

In operation, when the current sources 310 and 320 are enabled by an active ENF signal, the input circuit 330 provides ICK and ICKF clocks responsive to the IN and INF clocks, and the gain circuit 340 provides OUT and OUTF clocks responsive to the ICK and ICKF clocks. Characteristics of the OUT and OUTF clocks provided by the gain circuit 340 may be changed based on the DynDCC signal. For example, the OUT and OUTF clocks may have a first voltage swing when the DynDCC signal has a low logic level, and have a second voltage swing that is less than the first voltage swing when the DynDCC signal has a high logic level. As previously described, the characteristics of the OUT and OUTF clock may be changed, for example, based on a command and operation. For example, the first voltage swing may be used with write commands and the second voltage swing may be used with read commands.

With reference to the input circuit 330, current provided by the current source 310 is directed through the resistance 334 or the resistance 335 as controlled by the transistors 332 and 333, respectively. As the transistor 332 becomes relatively more conductive, greater current is provided through the resistance 334, thereby increasing a voltage of the ICK clock, and as the transistor 332 becomes relatively less conductive, less current is provided through the resistance 334, thereby decreasing the voltage of the ICK clock. Increasing a voltage of a clock represents the clock changing from a low clock level to a high clock level, and decreasing a voltage of the clock represents the clock changing from the high clock level to the low clock level. As the transistor 333 becomes relatively more conductive, greater current is provided through the resistance 335, thereby increasing a voltage of the ICKF clock, and as the transistor 333 becomes relatively less conductive, less current is provided through the resistance 335, thereby decreasing the voltage of the ICKF clock. The transistor 332 becomes relatively more conductive with a decreasing IN clock, and conversely, becomes relatively less conductive with an increasing IN clock. The transistor 333 becomes relatively more conductive with a decreasing INF clock, and conversely, becomes relatively less conductive with an increasing INF clock. As a result, with the IN and INF clocks complementary, the ICK clock changes from a low clock level to a high clock level and the ICKF clock changes from a high clock level to a low clock level as the IN clock changes from a high clock level to a low clock level (and the INF clock changes from a low clock level to a high clock level). Additionally, the ICK clock changes from a high clock level to a low clock level and the ICKF clock changes from a low clock level to a high clock level as the IN clock changes from a low clock level to a high clock level (and INF clock changes from a high clock level to a low clock level).

With reference to the gain circuit 340, the current provided by the current source 320 is directed through the variable resistance 344 or the variable resistance 345 as controlled by the transistors 342 and 343, respectively. As the transistor 342 becomes relatively more conductive with a decreasing voltage ICK clock, greater current is provided through the variable resistance 344 to increase voltage of the OUT clock, and as the transistor 342 becomes relatively less conductive with an increasing voltage ICK clock, less current is provided through the variable resistance 344 to decrease voltage of the OUT clock. Similarly, as the transistor 343 becomes relatively more conductive with a decreasing voltage ICKF clock, greater current is provided through the variable resistance 345 to increase voltage of the OUTF clock, and as the transistor 343 becomes relatively less conductive with an increasing voltage ICKF clock, less current is provided through the variable resistance 345 to decrease voltage of the OUTF clock. As a result, the OUT clock changes from a low clock level to a high clock level and the OUTF clock changes from a high clock level to a low clock level as the ICK clock changes from a high clock level to a low clock level (and the ICKF clock changes from a low clock level to a high clock level). Additionally, the OUT clock changes from a high clock level to a low clock level and the OUTF clock changes from a low clock level to a high clock level as the ICK clock changes from a low clock level to a high clock level (and ICKF clock changes from a high clock level to a low clock level).

Generally, for the receiver circuit 300, as the IN clock changes from a low clock level to a high clock level the OUT clock also changes from a high clock level to a low clock level and as the IN clock changes from a low clock level to a high clock level the OUT clock also changes from a low clock level to a high clock level, and similarly, as the INF clock changes from a high clock level to a low clock level the OUTF clock also changes from a high clock level to a low clock level and as the INF clock changes from a low clock level to a high clock level the OUTF clock also changes from a low clock level to a high clock level.

As previously described, the DynDCC signal may be used to change characteristics of the OUT and OUTF clocks. For example, when the DynDCC signal is a low logic level, the OUT and OUTF clocks have a larger voltage swing than when the DynDCC signal is a high logic level. Additionally, in embodiments including the resistance circuit 360, when the DynDCC signal is a low logic level, a crossing point for the OUT and OUTF clocks is generally greater than when the DynDCC signal is a high logic level.

When the DynDCC signal is a low logic level, the resistances of the variable resistances 344 and 345 are greater than when the DynDCC signal is at a high logic level. The higher resistances of the variable resistances 344 and 345 result in larger voltage changes in the OUT and OUTF clocks responsive to the oscillating ICK and ICKF clocks. In contrast, when the DynDCC signal is at a high logic level, the resistances of the variable resistances 344 and 345 are decreased. The lower resistances of the variable resistances 344 and 345 result in smaller voltage changes in the OUT and OUTF clocks responsive to the oscillating ICK and ICKF clocks in comparison to a low logic level DynDCC signal.

In the embodiment of FIG. 3, the high logic level DynDCC signal activates transistor 356 of the variable resistance 344 so that the resistance 354 is in parallel with the resistance 352, which causes the overall resistance of the variable resistance 344 between node A and the reference node to decrease. Similarly, the high logic level DynDCC signal activates transistor 357 of the variable resistance 345 so that the resistance 355 is in parallel with the resistance 353, which causes the overall resistance of the variable resistance 345 between node AF and the reference node to decrease.

In embodiments including the resistance circuit 360, a voltage difference between nodes A and AF may be controlled by the DynDCC signal. When the DynDCC signal is a low logic level, the voltage difference between nodes A and AF is based on the difference between voltages of the OUT and OUTF clocks. In contrast, when the DynDCC signal is a high logic level, the voltage difference between nodes A and AF is based on the difference between voltages of the OUT and OUTF clocks and reduced by resistance 362 of the resistance circuit. The high logic level DynDCC signal activates the transistors 364 and 365 to provide resistance 362 between the nodes A and AF, thereby reducing the voltage difference between the two nodes.

The variable resistances 344 and 345 are described with reference to FIG. 3 as including particular circuits. However, the variable resistances 344 and 345 may include additional and/or alternative circuits in other embodiments of the disclosure. Additionally, in other embodiments of the disclosure the DynDCC signal may be a bias signal used to change resistances of the variable resistances 344 and 345. For example, the resistances of the variable resistances 344 and 345 may be based on a voltage and/or current magnitude of the DynDCC signal. Embodiments of the disclosure are not intended to be limited by the specific circuits described with reference to FIG. 3, such as being limited to embodiments including the particular circuits shown in FIG. 3 for the variable resistances 344 and 345.

Figure 6:
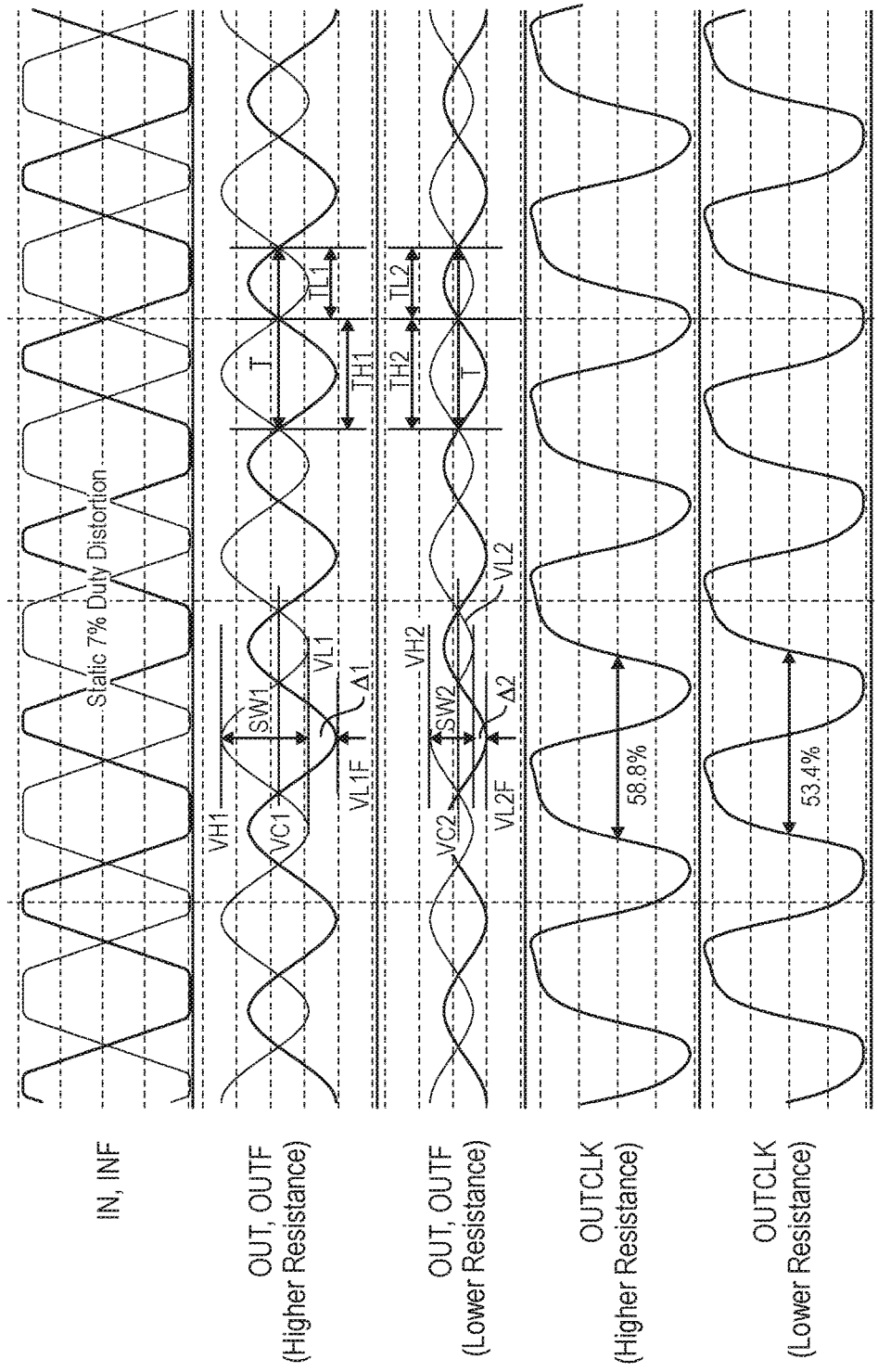
FIG. 6 is a timing diagram of various clocks during operation according to an embodiment of the disclosure.

An example of IN and INF clocks, and OUT and OUTF clocks for different logic levels of the DynDCC signal are shown in FIG. 6. FIG. 6 is a timing diagram of various clocks during operation according to an embodiment of the disclosure. The IN and INF clocks are complementary and are shown in the example of FIG. 6 having a duty cycle distortion (e.g., 7% duty cycle distortion). The resulting OUT and OUTF clocks shown in FIG. 6 are shown for two conditions: for a variable resistance set to a relatively higher resistance and deactivated resistance circuit (e.g., low logic level DynDCC signal with reference to the variable resistances 344 and 345, and resistance circuit 360 of FIG. 3) and for a variable resistance set to a relatively lower resistance and activated resistance circuit (e.g., high logic level DynDCC signal with reference to the variable resistances 344 and 345, and resistance circuit 360).

As shown in FIG. 6, for a relatively higher resistance, the OUT and OUTF clocks generally transition between VH1 (VH high voltage amplitude) and VL1 (VL low voltage amplitude) to provide a voltage swing of SW1. Also, the voltage at which the OUT and OUTF clocks cross is VC1. In contrast, for a relatively lower resistance, the OUT and OUTF clocks generally transition between VH2 and VL2 to provide a voltage swing of SW2. Also, the voltage at which the OUT and OUTF clocks cross is VC2. Comparing the two different conditions for the variable resistances, the voltage swing SW1 is greater than the voltage swing SW2. The lesser voltage swing SW2 of the OUT and OUTF clocks, when provided to a clock divider circuit (e.g., clock divider circuit 220 of FIG. 2), will result in iWCK0, iWCK90, iWCK180, and iWCK270 clocks that have less duty cycle distortion compared to the greater voltage swing SW1. The lower voltage for the crossing point VC2 of the OUT and OUTF clocks may further reduce duty cycle distortion when compared to the higher voltage crossing point VC1.

The lower voltage swing and/or lower voltage crossing point result in the OUT and OUTF clocks having more similar VH and VL voltages. For example, a difference DELTA1 between VH1 voltages (and VL1 voltages) for the OUT and OUTF clocks for a relatively higher resistance is greater than a difference between VH2 voltages (and VL2 voltages) for the OUT and OUTF clocks for a relatively lower resistance. The resulting OUT and OUTF clocks for the relatively lower resistance have less time difference between crossing points of the OUT and OUTF clocks. Less time difference between the crossing points of the OUT and OUTF clocks reflects less duty cycle distortion (the time difference between crossing points for a duty cycle perfect clock is zero). As shown in FIG. 6, while the clock periods for the OUT and OUTF clocks for the two conditions are the same, the time difference between times TH2 and TL2 for the relatively lower resistance condition is less than the time difference between times TH1 and TL1 for the relatively higher resistance condition, thus, reflecting less duty cycle distortion for the relatively lower resistance condition compared to the relatively higher resistance condition.

When provided to a clock divider circuit, the lower duty cycle distortion OUT and OUTF clocks results in lower duty cycle distortion iWCK0, iWCK90, iWCK180, and iWCK270 clocks. FIG. 6 further shows OUTCLK clocks for the two resistance conditions. The OUTCLK clock is an example clock that is based on one or more of the iWCK clocks, and reflects the different duty cycle distortion for OUTCLK clocks between a relatively high resistance condition and a relatively low resistance condition. As shown in FIG. 6, the OUTCLK clock for the relatively high resistance condition has greater duty cycle distortion compared to the OUTCLK clock for the relatively low resistance condition (e.g., 58.8% duty cycle for the relatively high resistance condition versus 53.4% duty cycle for the relatively low resistance condition).

Figure 4:
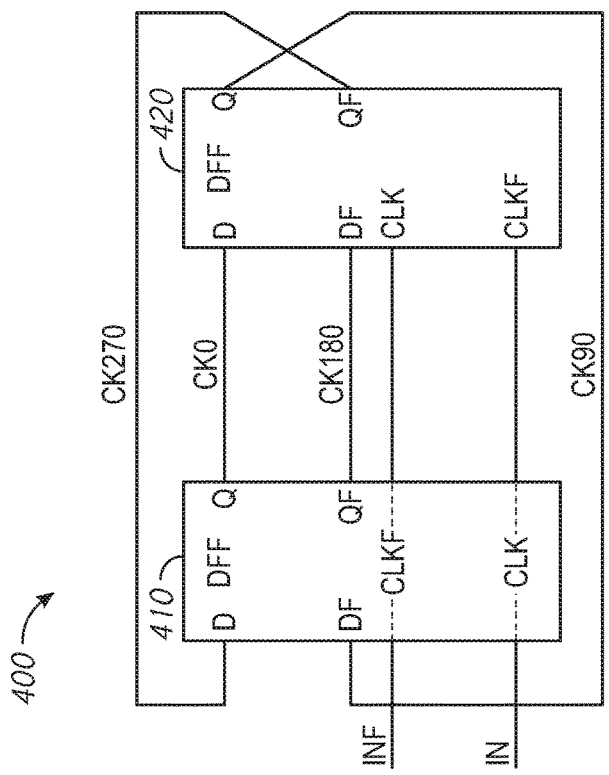
FIG. 4 is a block diagram of a clock divider circuit according to an embodiment of the disclosure.

FIG. 4 is a block diagram of a clock divider circuit 400 according to an embodiment of the disclosure. The clock divider circuit 400 may be included in the clock divider circuit 220 of FIG. 2 in some embodiments of the disclosure.

The clock divider circuit 400 may be included in the clock input circuit 120 of the semiconductor device 100 in some embodiments of the disclosure. The clock divider circuit 400 may be included in the clock divider circuit 220 of FIG. 2 in some embodiments of the disclosure. In such embodiments, the IN and INF clocks of FIG. 4 may be provided by the OUT and OUTF clocks of FIG. 2.

The clock divider circuit 400 includes D flip-flop (DFF) circuits 410 and 420. Input clocks IN and INF are provided to clock inputs CLK and CLKF of the DFF circuits 410 and 420. In some embodiments of the disclosure, the DFF circuits 410 and 420 are current mode logic D flip-flop circuits. The DFF circuits 410 and 420 are clocked by the IN and INF clocks. Clocking by the IN and INF clocks cause the FF circuits 424 and 428 to receive complementary input signals at respective data inputs D and DF and provide complementary output signals at data outputs Q and QF. The clock divider circuit 400 provides multiphase clocks CK0, CK90, CK180, and CK270. The CK0 clock is provided at data output Q of the DFF circuit 410, the CK90 clock is provided at data output Q of the DFF circuit 420, the CK180 clock is provided at data output QF of the DFF circuit 410, and the CK270 clock is provided at data output QF of the DFF circuit 420. The CK0 clock is provided to data input D of the DFF circuit 420, the CK90 clock is provided to data input DF of the DFF circuit 410, the CK180 clock is provided to data input DF of the DFF circuit 420, and the CK270 clock is provided to data input D of the DFF circuit 410.

In operation, the clock divider circuit 400 provides the multiphase clocks CK0, CK90, CK180, and CK270 responsive to active IN and INF clocks (the IN and INF clocks oscillate between high and low clock levels). For complementary IN and INF clocks, the multiphase clocks CK0, CK90, CK180, and CK270 provided by the clock divider 400 have a 90 degree relative phase to one another. The multiphase clocks CK0, CK90, CK180, and CK270 have a clock frequency that is one-half of a clock frequency of the IN and INF clocks.

As the IN and INF clocks change between high and low clock levels, the DFF circuits 410 and 420 are clocked to receive the logic levels applied to the respective data inputs D and DF and provide the logic levels at the respective data outputs Q and QF. As the logic levels of the outputs change responsive to the clocking IN and INF clocks, the logic levels at the data inputs D and DF to which the respective clocks CK0, CK90, CK180, and CK270 are provided also change. As a result, when the IN and INF clocks change between high and low clock levels, the new logic levels at the respective data inputs D and DF are received and provided at the respective data outputs Q and QF. The continual clocking by the IN and INF clocks cause the logic levels at the data inputs and data outputs of the DFF circuits 410 and 420 to change continually and periodically. Due to the DFF circuits 410 and 420 being coupled in series, the resulting multiphase clocks CK0, CK90, CK180, and CK270 have one-half the clock frequency of the IN and INF clocks, as previously described.

Figure 5:
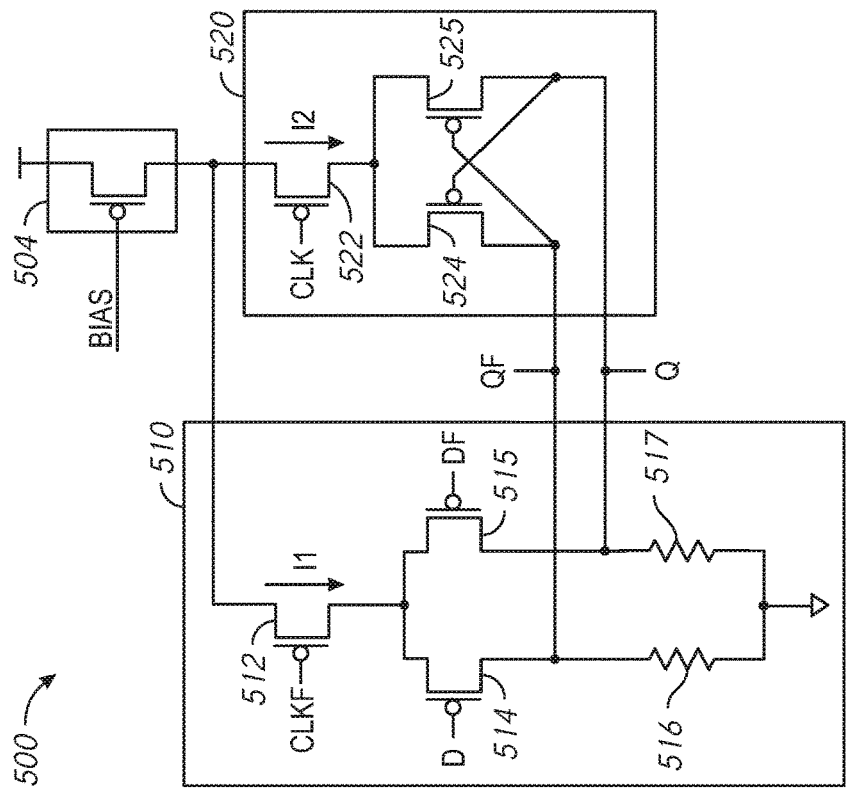
FIG. 5 is a schematic diagram of a D flip-flop (DFF) circuit according to an embodiment of the disclosure.

FIG. 5 is a schematic diagram of a D flip-flop (DFF) circuit 500 according to an embodiment of the disclosure. In some embodiments of the disclosure, the DFF circuit 500 may be included in one or both of the DFF circuits 410 and 420 of FIG. 4.

The DFF circuit 500 includes a current source 504, and an input circuit 510 and a latch circuit 520. The current source 504 is configured to be coupled to high supply node configured to be provided a power supply. The current source 504 provides current based on a bias signal BIAS. For example, the magnitude of the BIAS signal controls the magnitude of current provided by the current source 504 by setting conductivity of a transistor included in the current source 504. The current from the current source is provided to the input circuit 510 and the latch circuit 520. The input circuit 510 includes a transistor 512 coupled to the current source 504. The transistor 512 provides current I1 from the current source 504 responsive to a clock provided to a clock input CLKF. The input circuit further includes an input transistor 514 and a resistance 516 coupled in series from the transistor 512 to a low supply node configured to be provided a reference voltage (e.g., ground). The input circuit 510 further includes an input transistor 515 and a resistance 517 coupled in series from the transistor 512 to the low supply node. Data is provided to the data input D of input transistor 514 and complementary data is provided to the data input DF of input transistor 515, and the transistor 512 is activated by the clock provided to the clock input CLKF. Based on the data provided to the data inputs D and DF, the input circuit 510 provides complementary output data at the data outputs Q and QF.

The latch circuit 520 includes a transistor 522, and transistors 524 and 525. The transistors 524 and 525 are cross-coupled to form a latch for the output data provided at data outputs Q and QF. The transistor 522 is coupled from the current source 504 to the transistors 524 and 525. The transistor 522 provides current I2 to the transistors 524 and 525 responsive to a clock provided to a clock input CLK.

In operation, when the current source 504 provides power to the input circuit 510 and latch circuit 520, the input circuit 510 provides output data at data outputs Q and QF based on the logic levels of the data provided to the data inputs D and DF and responsive to the clock provided to the clock input CLKF. The output data at the data outputs Q and QF are latched by the latch circuit 520 responsive to the clock provided to the clock input CLK. In particular, in the embodiment of FIG. 5, output data based on data provided to the data inputs D and DF is provided at data outputs Q and QF responsive to a low clock level of the clock provided to the clock input CLKF, and the output data provided at data outputs Q and QF are latched responsive to a low clock level of the clock provided to the clock input CLK.

With reference to the input circuit 510, current provided by the current source 504, when the transistor 512 is activated by a low clock level clock provided to the clock input CLKF, is directed through the resistance 516 or the resistance 517 as controlled by the transistors 514 and 515, respectively. As the transistor 514 becomes relatively more conductive with a decreasing voltage data at the data input D, greater current is provided through the resistance 516 to increase voltage of the data output QF, and as the transistor 514 becomes relatively less conductive with an increasing voltage data at the data input DF, less current is provided through the resistance 516 to decrease voltage of the data output QF. Similarly, as the transistor 515 becomes relatively more conductive with a decreasing voltage data provided at data input DF, greater current is provided through the resistance 517 to increase voltage of the data output Q, and as the transistor 515 becomes relatively less conductive with an increasing voltage data at the data input DF, less current is provided through the resistance 517 to decrease voltage of the data output Q.

As a result, for low logic level data at the data input D (and high logic level data at the data input DF), the output data provided at the data output QF is a high logic level and the output data provided at the data output Q is a low logic level, and for high logic level data at the data input D (and low logic level data at the data input DF), the output data provided at the data output QF is a low logic level and the output data provided at the data output Q is a high logic level. The data at the outputs Q and QF provided by the input circuit 510 are latched by the latch circuit 520 when the clock provided to the clock input CLK is a low clock level.

As previously described, receiver circuits according to an embodiment of the disclosure reduce duty cycle distortion by providing the OUT and OUTF clocks with lower voltage swing (e.g., lower high voltage amplitude VH and lower low voltage amplitude VL) and/or with lower voltage crossing points. The receiver circuits may reduce dynamic duty cycle distortion, which is caused by changing operating conditions, during generation of clocks used to provide other clocks. In embodiments of the disclosure that include such a receiver and a divider circuit as previously described, further reduction of duty cycle distortion for multiphase clocks may be obtained. For example, a clock circuit may include receiver circuit 300 (FIG. 3) or 700 (FIG. 7), and a divider circuit 400 (FIG. 4) that includes the DFF circuit 500 (FIG. 5) in some embodiments of the disclosure. In such embodiments, the reduced amplitude and lower voltage crossing point OUT and OUTF clocks provided by the receiver circuit to the divider circuit will cause the divider circuit to provide multiphase clocks having reduced duty cycle distortion, for example, when compared with the multiphase clocks from a conventional clock circuit. The multistage approach for reducing duty cycle distortion includes a first stage provided by the receiver circuit and a second stage provided by the divider circuit.

With reference to FIGS. 4 and 5, the OUT and OUTF clocks provided by the receiver circuit result in less difference between currents I1 and I2 of the DFF circuits. As a result, the current I1 of a first DFF circuit (e.g., DFF circuit 410) is more balanced with current I1 of a second DFF circuit (e.g., DFF circuit 420), and the delay difference between the first and second DFF circuits is reduced. The balanced currents I1 and I2 for the DFF circuits result in the slopes of the generated multiphase clocks to be more similar, and consequently, the rise and fall times of the multiphase clocks are also more similar resulting in clocks with reduced duty cycle distortion. Moreover, switching of circuits in the first and second DFF circuits is also more balanced, so that the phase skew between the CK0 and CK90 clocks is more balanced resulting in clocks with reduced duty cycle distortion.

Thus, while the receiver circuits, such as receiver circuits 300 and 700 may provide OUT and OUTF clocks with reduced duty cycle distortion relative to the IN and INF clocks, providing the OUT and OUTF clocks having reduced voltage swing and/or lower voltage crossing point to the divider circuit may further result in CK0, CK90, CK180, and CK270 having reduced duty cycle distortion relative to OUT and OUTF clocks with greater voltage swings and/or higher voltage crossing point.

Figure 7:
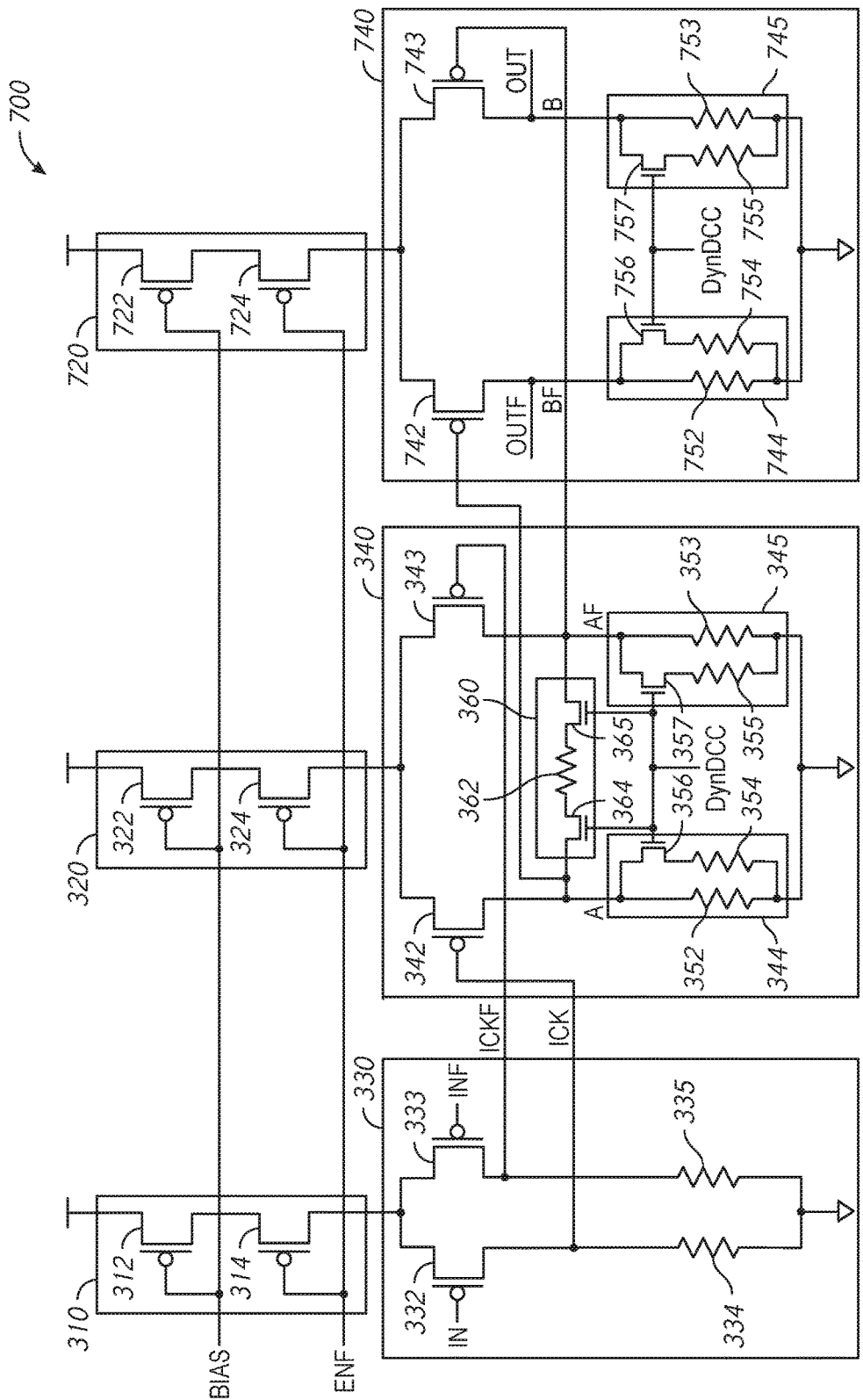
FIG. 7 is a schematic diagram of a receiver circuit according to an embodiment of the disclosure.

FIG. 7 is a schematic diagram of a receiver circuit 700 according to an embodiment of the disclosure. The receiver circuit 700 may be included in the clock input circuit 120 of the semiconductor device 100 in some embodiments of the disclosure. The receiver circuit 700 may be included in the receiver circuit 210 of FIG. 2 in some embodiments of the disclosure. In such embodiments, the IN and INF clocks of FIG. 7 may be provided by the WCK and WCKF clocks of FIG. 2.

The receiver circuit 700 is similar to the receiver circuit 300 of FIG. 3. For example, the receiver circuit 700 includes current sources 310 and 320, and input circuit 330 and the gain circuit 340. In contrast, however, the receiver circuit 700 further includes current source 720 and an output circuit 740. The description for current sources 310 and 320, and the input circuit 330 and the gain circuit 340 of the receiver circuit 300 may also be applied to the receiver circuit 700. Consequently, description for the current sources current sources 310 and 320, and the input circuit 330 and the gain circuit 340 will not be repeated here in the interest of brevity.

The current source 720 includes transistors 722 and 724 coupled in series, with a bias signal BIAS provided to the transistor 722 and an enable signal ENF provided to the transistor 724. The magnitude of the BIAS signal controls the magnitude of current provided by the current source 720 (as well as for the current sources 310 and 320). The ENF signal is provided to the transistor 724. An active ENF signal activates the transistor 724 to allow current from the transistor 722 to be provided.

The output circuit 740 includes an input transistor 742 and a variable resistance 744 coupled in series from the current source 720 to a low supply node. As previously described, the low supply node is provided a reference voltage (e.g., ground). The output circuit 740 further includes an input transistor 743 and variable resistance 745 coupled in series from the current source 720 to the low supply node. In some embodiments of the disclosure, for example, in the embodiment shown in FIG. 7, the variable resistance 744 includes a resistance 752 coupled to a node BF and the low supply node and further includes transistor 756 coupled in series with resistance 754 from node BF to the low supply node. The variable resistance 745 includes a resistance 753 coupled to a node B and the low supply node and further includes transistor 757 coupled in series with resistance 755 from node B to the low supply node. An activation signal DynDCC is provided to the variable resistances 744 and 745. The input transistor 742 is coupled to node A of the gain circuit 340 and the input transistor 743 is coupled to node AF of the gain circuit 340. Output clock OUT is provided at node B and output clock OUTF is provided at node BF of the output circuit 740.

Operation of the current sources 310 and 320, and of the input circuit 330 and the gain circuit 340 has been previously described with reference to FIG. 3. However, the clocks provided at nodes A and AF of the gain circuit 340 (i.e., node A clock and node AF clock, respectively) are provided to the input transistor 742 and to the input transistor 743, respectively, of the output circuit 740.

With reference to the output circuit 740, the current provided by the current source 720 is directed through the variable resistance 744 or the variable resistance 745 as controlled by the transistors 742 and 743, respectively. As the transistor 742 becomes relatively more conductive with a decreasing voltage node A clock (from the gain circuit 340), greater current is provided through the variable resistance 744 to increase voltage of the OUTF clock provided at node BF. As the transistor 742 becomes relatively less conductive with an increasing voltage node A clock, less current is provided through the variable resistance 744 to decrease voltage of the OUTF clock provided at node BF. Similarly, as the transistor 743 becomes relatively more conductive with a decreasing voltage node AF clock, greater current is provided through the variable resistance 745 to increase voltage of the OUT clock provided at node B, and as the transistor 743 becomes relatively less conductive with an increasing voltage node AF clock, less current is provided through the variable resistance 745 to decrease voltage of the OUT clock provided at node B.

As a result, the OUT clock changes from a high clock level to a low clock level and the OUTF clock changes from a low clock level to a high clock level as the node A clock changes from a high clock level to a low clock level (and the node AF clock changes from a low clock level to a high clock level). Additionally, the OUT clock changes from a low clock level to a high clock level and the OUTF clock changes from a high clock level to a low clock level as the node A clock changes from a low clock level to a high clock level (and node AF clock changes from a high clock level to a low clock level).

Generally, for the receiver circuit 700, when the IN clock changes from a high clock level to a low clock level (and the INF clock changes from a low clock level to a high clock level) the OUT clock also changes from a high clock level to a low clock level and the OUTF clock changes from a low clock level to a high clock level. Additionally, when the IN clock changes from a low clock level to a high clock level (and the INF clock changes from a high clock level to a low clock level) the OUT clock also changes from a low clock level to a high clock level and the OUTF clock changes from a high clock level to a low clock level.

Similar to the gain circuit 340, the DynDCC signal may be used to change characteristics of the OUT and OUTF clocks provide by the output circuit 740. For example, when the DynDCC signal is a low logic level, the OUT and OUTF clocks have a larger voltage swing than when the DynDCC signal is a high logic level. Additionally, in embodiments including the resistance circuit 360, when the DynDCC signal is a low logic level, a crossing point for the OUT and OUTF clocks is generally greater than when the DynDCC signal is a high logic level.

Operation of the variable resistances 744 and 745 is similar to the operation of the variable resistances 344 and 345 as previously described. For example, the variable resistances 744 and 745 have relatively lower resistances for a high logic level DynDCC signal and have relatively higher resistances for a low logic level DynDCC signal. As also previously described, a relatively high variable resistance results in OUT and OUTF clocks having a larger voltage swing than for OUT and OUTF clocks for a relatively low variable resistance. The lower voltage swing OUT and OUTF clocks may be used to provide multiphase clocks having lower duty cycle distortion when compared to OUT and OUTF clocks for relatively higher variable resistance. For the receiver circuit 700, the additional control over the voltage swing of the OUT and OUTF clocks provided by the output circuit 740 may further reduce duty cycle distortion in multiphase clocks generated from the OUT and OUTF clocks compared to the receiver circuit 300.

The resulting OUT and OUTF clocks provided by the receiver circuit 700 may be similar to those previously described with reference to FIG. 6.

Although FIG. 7 illustrates the receiver circuit 700 as including an output circuit 740 that does not include a resistance circuit (e.g., resistance circuit 360 of the gain circuit 340), in some embodiments of the disclosure the output circuit 740 includes a resistance circuit. Moreover, the resistance circuit 360 may be omitted from the gain circuit 340 without departing from the scope of the disclosure. The scope of the disclosure further includes receiver circuits that include additional circuits for further control over the voltage swing and/or crossing point for the OUT and OUTF clocks.

From the foregoing it will be appreciated that, although specific embodiments of the disclosure have been described herein for purposes of illustration, various modifications may be made without deviating from the spirit and scope of the disclosure. For example, various transistors have been shown as n-type and p-type field effect transistors. However, the specific examples of the n-type and p-type field effect transistors are not intended to limit the scope of the disclosure, and it will be appreciated that other types of circuits may be used without departing from the scope of the disclosure. Accordingly, the scope of the disclosure should not be limited any of the specific embodiments described herein.

What is claimed is:

1. An apparatus, comprising:
 a gain circuit comprising a first variable resistance coupled from a first output node to a reference voltage node and a second variable resistance coupled from a second output node to the reference voltage node, each of the first and second variable resistances is configured to have a first resistance in a first mode and a second resistance in a second mode, wherein the gain circuit is configured to provide output complementary clocks at the first output node and the second output nodes, respectively, and to cause a first voltage difference between the output complementary clocks in the first mode to be lower than a second voltage difference between the output complementary clocks in the second mode.

2. The apparatus of claim 1 further comprising a first input transistor and a second input transistor coupled between a current source and the first and second output nodes, respectively, wherein the first and second input transistors are configured to provide current from the current source to the first and second variable resistances responsive to input complementary clocks.

3. The apparatus of claim 2, wherein the gain circuit is configured to provide current from the current source to the first and second input transistors responsive to an enable signal provided by a command decoder.

4. The apparatus of claim 1, wherein the first and second variable resistances are coupled to a common signal line and are configured to change resistance values responsive to a duty cycle correction signal at the common signal line.

5. The apparatus of claim 4, wherein:
 the first variable resistance includes a first transistor and a first resistor coupled in series between the first output node and the reference voltage node; and
 the second variable resistance includes a second transistor and a second resistor coupled in series between the second output node and the reference voltage node;
 wherein each of the first and second transistors is coupled to the common signal line to change the resistance values of the first and second variable resistances, respectively, responsive to the duty cycle correction signal at the common signal line.

6. The apparatus of claim 5, wherein:
 the first variable resistance includes a third resistor coupled between the first output node and the reference voltage node, and also coupled in parallel with the series coupled first transistor and first resistor; and
 the second variable resistance includes a fourth resistor coupled between the second output node and the reference voltage node, and also coupled in parallel with the series coupled second transistor and second resistor.

7. The apparatus of claim 4 further comprising a resistance circuit coupled between the first and second output nodes to cause a first crossing point of the output complementary clocks in the first mode to be lower than a second crossing point of the output complementary clocks in the second mode.

8. The apparatus of claim 7, wherein the resistance circuit comprises a resistor and at least a transistor coupled to the common signal line to provide a resistance between the first and second output nodes when the duty cycle correction signal is active.

9. An apparatus, comprising:
 a first gain circuit comprising a first variable resistance coupled from a first output node to a first reference voltage node and a second variable resistance coupled from a second output node to the first reference voltage node; and
 a second gain circuit coupled to the first gain circuit and configured provide first output complementary clocks, and to cause a first voltage difference between the first output complementary clocks in a first mode to be lower than a second voltage difference between the first output complementary clocks in a second mode.

10. The apparatus of claim 9, wherein the second gain circuit comprises a third variable resistance coupled from a third output node to a second reference voltage node and a fourth variable resistance coupled from a fourth output node to the second reference voltage node, and wherein the second gain circuit is configured to provide the first output complementary clocks at the fourth output node and the third output nodes, respectively.

11. The apparatus of claim 10, wherein the first gain circuit is further configured to receive current from a first current source responsive to input complementary clocks and provide second output complementary clocks at the first output node and the second output node, respectively.

12. The apparatus of claim 11, wherein the second gain circuit is further configured to receive current from a second current source responsive to the second output complementary clocks from the first gain circuit.

13. The apparatus of claim 11, wherein the first gain circuit comprises a first input transistor and a second input transistor coupled between a current source and the first and second output nodes, respectively, wherein the first and second input transistors are configured to provide the current from the first current source to the first and second variable resistances responsive to the input complementary clocks.

14. The apparatus of claim 13, wherein the first gain circuit is configured to provide the current from the first current source to the first and second input transistors responsive to an enable signal provided by a command decoder.

15. The apparatus of claim 12, wherein the second gain circuit further comprises a third input transistor and a fourth input transistor coupled between the second current source and the third and fourth output nodes, respectively, wherein the third and fourth input transistors are configured to provide the current from the second current source to the third and fourth variable resistances, respectively, responsive to the second output complementary signals at the third and fourth output nodes.

16. The apparatus of claim 10, wherein:
the first and second variable resistances are coupled to a common signal line and are configured to change resistance values responsive to a duty cycle correction signal at the common signal line; and
the third and fourth variable resistances are coupled to the common signal line and are configured to change resistance values responsive to the duty cycle correction signal at the common signal line.

17. The apparatus of claim 16, wherein:
the first variable resistance includes a first transistor and a first resistor coupled in series between the first output node and the first reference voltage node; and
the second variable resistance includes a second transistor and a second resistor coupled in series between the second output node and the first reference voltage node;
the third variable resistance includes a third transistor and a third resistor coupled in series between the third output node and the second reference voltage node; and
the fourth variable resistance includes a fourth transistor and a fourth resistor coupled in series between the fourth output node and the second reference voltage node;
wherein each of the first, second, third and fourth transistors is coupled to the common signal line to change the resistance values of the first, the second, the third and the fourth variable resistances, respectively, responsive to the duty cycle correction signal at the common signal line.

18. The apparatus of claim 17, wherein:
the first variable resistance includes a fifth resistor coupled between the first output node and the first reference voltage node, and also coupled in parallel with the series coupled first transistor and the first resistor;
the second variable resistance includes a sixth resistor coupled between the second output node and the first reference voltage node, and also coupled in parallel with the series coupled second transistor and the second resistor;
the third variable resistance includes a seven resistor coupled between the first output node and the second reference voltage node, and also coupled in parallel with the series coupled third transistor and the third resistor; and
the fourth variable resistance includes an eighth resistor coupled between the second output node and the second reference voltage node, and also coupled in parallel with the series coupled fourth transistor and the fourth resistor.

19. The apparatus of claim 16 further comprising a resistance circuit coupled between the first and second output nodes to cause a first crossing point of the output complementary clocks in the first mode to be lower than a second crossing point of the output complementary clocks in the second mode.

20. The apparatus of claim 19, wherein the resistance circuit comprise a resistor and at least a transistor coupled to the common signal line to provide a resistance between the first and second output nodes when the duty cycle correction signal is active.

* * * * *